United States Patent [19]

Okumura et al.

[11] Patent Number: 5,032,491

[45] Date of Patent: Jul. 16, 1991

[54] METHOD OF FORMING A FINE PATTERN

[75] Inventors: Katsuya Okumura; Tohru Watanabe, both of Yokohama, Japan

[73] Assignee: Kabushiki Kaisha Toshiba, Kawasaki, Japan

[21] Appl. No.: 234,725

[22] Filed: Aug. 22, 1988

[30] Foreign Application Priority Data

Aug. 20, 1987 [JP] Japan .................. 62-206745

[51] Int. Cl.$^5$ .................... G03C 5/00
[52] U.S. Cl. .................... 430/314; 430/317
[58] Field of Search .................. 430/314, 317

[56] References Cited

U.S. PATENT DOCUMENTS

| 4,599,137 | 7/1986 | Akiya .................. 156/643 |
| 4,634,645 | 1/1987 | Matsuda et al. .......... 430/30 |
| 4,707,218 | 11/1987 | Giammarco et al. ........ 156/643 |
| 4,732,658 | 3/1988 | Lee .................... 437/228 |

FOREIGN PATENT DOCUMENTS

| 0150597 | 8/1985 | European Pat. Off. . |
| 0151948 | 8/1985 | European Pat. Off. . |
| 0265638 | 5/1988 | European Pat. Off. . |
| 58-132927 | 8/1983 | Japan . |
| 59-76428 | 5/1984 | Japan . |
| 59-163829 | 9/1984 | Japan . |
| 61-54629 | 3/1986 | Japan . |

OTHER PUBLICATIONS

H. Watanabe "Submicron Feature Patterning Using Spin-On Glass Image Reversal (Sogir)"; 1046 Journal of the Electrochemical Society; 134 (1987)Mar., No. 3, Abstract No. 168.

Primary Examiner—Charles L. Bowers, Jr.
Assistant Examiner—Ashley I. Pezzner
Attorney, Agent, or Firm—Foley & Lardner

[57] ABSTRACT

A photoresist is coated on a substrate to form a planar surface, thus to form a recessed portions corresponding to a mask of a pattern to be formed in the photoresist layer having planar surface. $SiO_2$ etc. are deposited into the recessed portions to prepare a mask, thus to form a fine pattern by anisotropic etching. As a result, by films remaining below the recessed portions formed in the photoresist layer having planar surface, a fine pattern is formed.

6 Claims, 8 Drawing Sheets

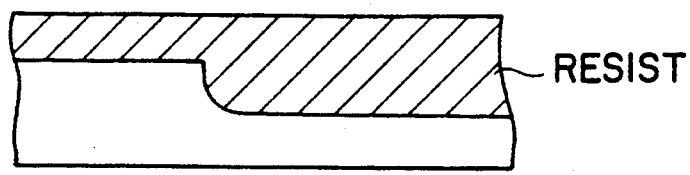
FIG.9a — RESIST
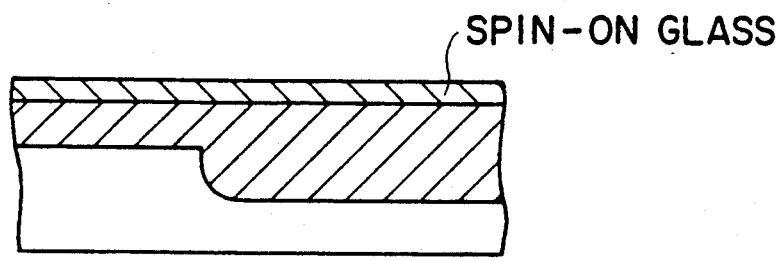
FIG.9b — SPIN-ON GLASS
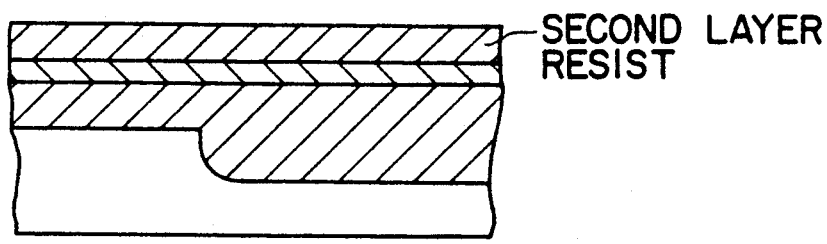
FIG.9c — SECOND LAYER RESIST
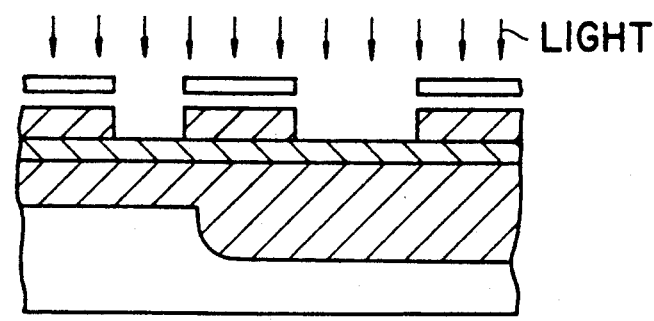
FIG.9d — LIGHT
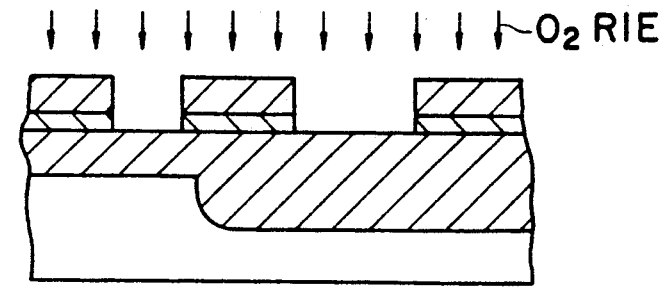
FIG.9e — O₂ RIE
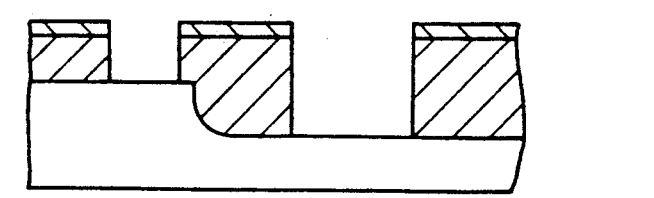
FIG.9f — O₂ RIE

METHOD OF FORMING A FINE PATTERN

BACKGROUND OF THE INVENTION

1. Field of the Art

This invention relates to a method of forming a fine pattern, and more particularly a method of forming a fine pattern of less than submicron order in a manufacturing of a VLSI (Very Large Scale Integrated Circuit).

2. Prior Art

Photoresists have been conventionally used for forming a pattern in manufacturing of LSI. Among two types of photoresists, a positive resist having resolution superior to that of a negative resist is generally used for forming a fine pattern of less than submicron order. However, with such a positive resist, it is ordinary that fine space pattern or opening pattern inferior to the resolution is only formed.

In addition, as a result of the fact that light having a short wavelength is used for exposure in the formation of pattern of submicron order in recent years, the depth of a focus becomes shallow, resulting in difficulty in coping with such a circumstance that there is any offset on a substrate.

SUMMARY OF THE INVENTION

This invention has been made in consideration of the above circumstances, and has an object to provide a method of forming a fine pattern of photoresist, which permits a fine pattern of limit resolution of photoresist or less than that irrespective of an offset on a substrate, and which has a reduced number of process steps.

A method of forming a fine pattern according to this invention is characterized in that the method includes a first step for coating a photoresist on a surface on which a pattern is to be formed, a second step for forming recessed portions defining a predetermined fine pattern in the photoresist so that the recessed portions are exposed to the outside, a third step for depositing a material having an etch rate different from that of the photoresist into the recessed portions, and a fourth step for removing the photoresist with the material deposited within the recessed portions being as a mask.

DETAILED DESCRIPTION OF THE INVENTION

Prior Art

Figure 7:
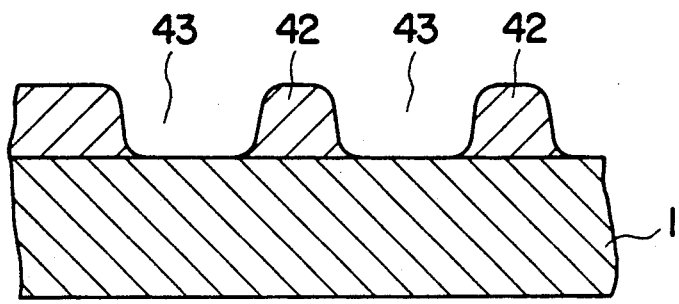
FIGS. 7 and 8 are schematic cross sectional views for explaining a conventional method of forming a fine pattern, respectively.
Figure 8:
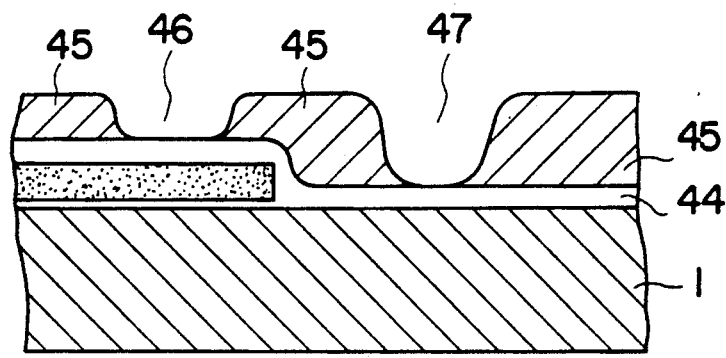

A conventional method of forming a pattern using a photoresist will be described with reference to FIGS. 7 and 8. In the case of depositing a photoresist, e.g., having a resolution of 1 μm on a substrate 1, thereafter to form a pattern using a mask pattern of line/space having a width of 1 μm, there is a tendency that photoresists 42 having been subjected to patterning on lines become narrow, whereas spaces 43 become broad as shown in FIG. 7, so that it is practically difficult to form a pattern of line/space having a width of 1 μm. Even in the case of forming a pattern of contact holes of 1 μm in dimension in a manner similar to the above, because the side surfaces of respective photoresist 42 having been subjected to patterning have a regular taper or inclination in the vicinity of the limit resolution of the pattern, it is also impossible to open contact holes of 1 μm using such photoresists.

Further, since, e.g., a polysilicon layer or a silicon oxide film is ordinarily formed on the substrate 1 and there is an offset of about 1 μm in the film 44 to be subjected to patterning, there occurs a difference in the film thickness of photoresist in coating photoresist. Thus, the film thickness of the photoresist becomes uneven because of such an offset, so that it is difficult to obtain an optimum condition for exposure and development of the entirety of photoresist. Namely, an optimum condition for exposure and development at the portion which is thick in the thickness of the photoresist is different from that at the portion which is thin therein. At the portion which is thin in film thickness, exposure and development become excessive by any means. Accordingly, spaces or contact holes are to become large. Especially, as a result of the fact that times of submicron order have come and exposure has been carried out using light having a short wavelength, the depth of a focus becomes equal to the order of 1.0 or 0.5 μm, resulting in the tendency that the exposure condition changes to much degree accordingly. The space 46 at the portion which is thin in the film thickness of the photoresist 45 having been subjected to patterning in this way becomes larger than the space 47 at the portion which is thick in the film thickness thereof. In opening contact holes in a portion which is thick in the film thickness of the photoresist, even in the case that such contact holes could be opened, residues appear on the bottom portions of the opened contact holes since they may not be sufficiently subjected to cleaning at the time of development because of large aspect ratio, resulting in the possibility that the opening yield is lowered.

As just described above, in the conventional method of forming a fine pattern, there were problems that it is impossible to form a fine pattern of photoresist with a limit resolution of photoresist or less than that, and that a pattern of photoresist formed becomes uneven in dimensions because of unevenness of the film thickness of photoresist resulting from an offset on a substrate.

Figure 9:
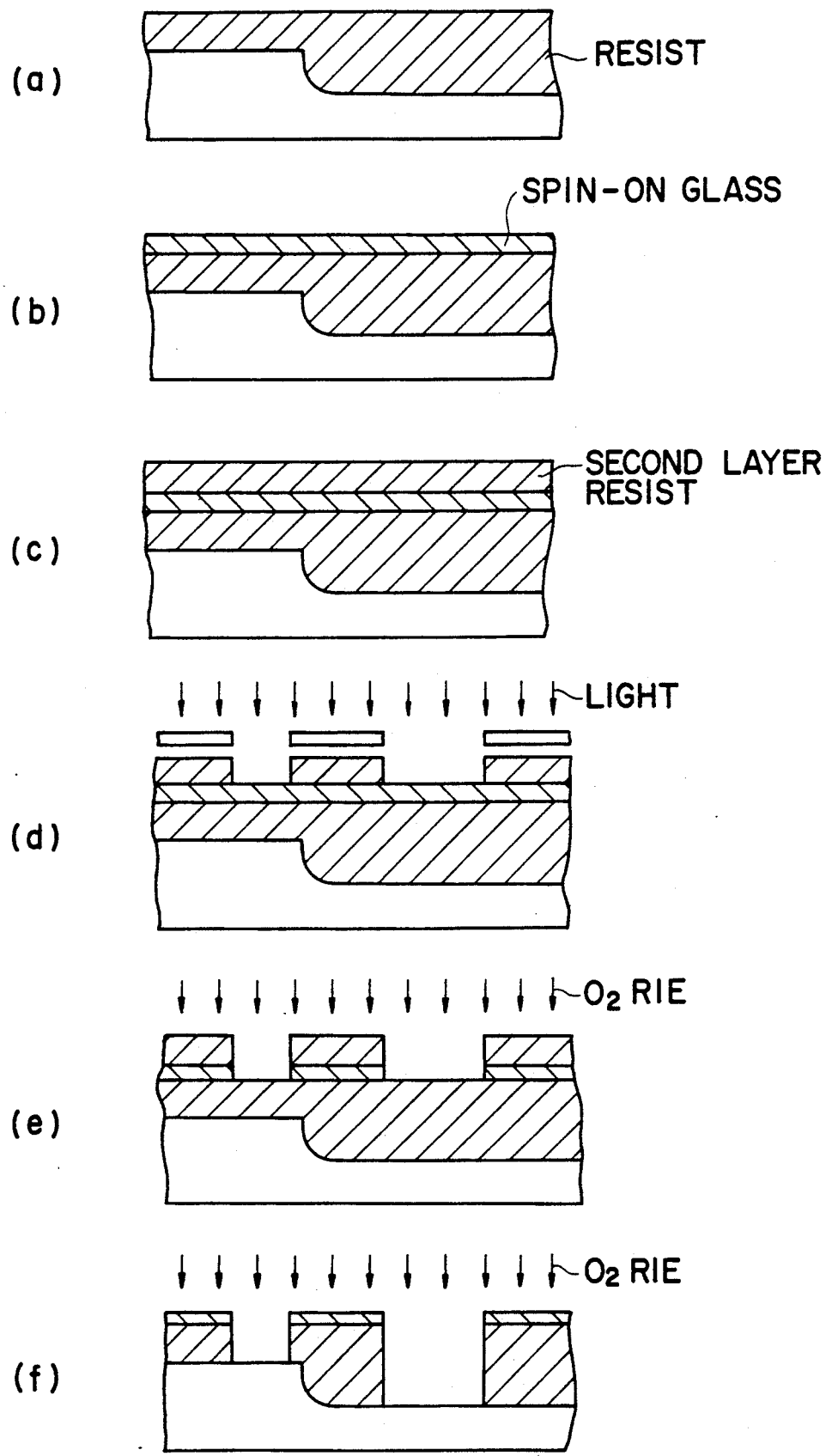
FIG. 9 is an explanatory view of a multi-layer resist process conventionally used in the formation of a fine pattern.

On the other hand, for a method of forming a fine pattern, there has been conventionally known a method called a multi-layer resist process or stacked resist process. This method requires, as shown in FIG. 9, process steps of ① coating of first interlayer resist (FIG. 9(a)), ② spin-on glass coating (FIG. 9(b)), ③ coating of a second layer resist (FIG. 9(c), ④ patterning by exposure/development (FIG. 9(d)), ⑤ patterning of a glass layer by RIE (FIG. 9(e)), ⑥ resist etching by O₂RIE (FIG. 9(f)) and ⑦ etching of underlying layer with the spin-on glass and the second interlayer resist being as a mask.

Embodiments

A method of forming a fine pattern according to a first embodiment of this invention will be described with reference to FIG. 1. On a substrate 1, a film 2 of a conductive film, such as, for example, a polysilicon film or an aluminum film is formed. The film 2 subjected to patterning in accordance with a wiring pattern includes an offset on the surface thereof. A photoresist 3 is sufficiently thickly coated on the film 2 to thereby eliminate the offset so that the photoresist 3 surface becomes planar. Since the photoresist 3 surface subject to exposure is thus planarized, there is no possibility that focus undesirably deviates from a normal position, with the result that the stepper (stepping projection aligner) can exhibit the maximum performance. In the first embodiment, the thickness of the photoresist 3 was about 2 $\mu$m (FIG. 1(a)).

Then, by using a mask having positive/negative surfaces opposite to those of a mask conventionally used, a pattern having a width of 1 $\mu$m is transferred onto the photoresist 3. At this time, the condition for exposure and development is set such that a photoresist having a film thickness of substantially 0.5 $\mu$m is subjected to exposure and development to form recessed portions 4 at the top surface of the photoresist 3 and having a width of 1 $\mu$m and a depth of substantially 0.5 $\mu$m in the layer formed by the photoresist 3. At this time, photoresist 3 sides defining respective recessed portions 4 have a gentle regular taper or inclination (FIG. 1(b)). The provision of such regular tapers is convenient in that the film is prevented from being brought into a perforated state at the time of formation of the film.

In the case of forming a pattern having a width of 1 $\mu$m, when each recessed portion 4 has a width of 1.2 $\mu$m and each portion between adjacent recessed portions 4 has a width of 0.8 $\mu$m, exposure is easily conducted, and the width of the wiring portion formed below each recessed portion at the subsequent process step becomes equal to 1.2 $\mu$m, so that the wiring width is allowed to be broad in comparison with the pitch (2 $\mu$m), thus permitting a large current to flow.

Using LPD (Liquid Phase Deposition) method (see Japanese Laid-Open Patent Publication No. 57-196744), an SiO$_2$ film (glass layer) 5 is deposited on the photoresist 3. This deposition method is to immerse a substrate into an immersion liquid of hydrofluoric acid (H$_2$SiF$_6$) supersaturated with SiO$_2$, and is characterized in that the film thickness is entirely uniform. In accordance with this method, since deposition is enabled at a temperature nearly equal to a room temperature, there is no possibility that photoresist is damaged even if SiO$_2$ film is deposited on photoresist. In the first embodiment, SiO$_2$ film 5 having a film thickness of about 0.7 $\mu$m was deposited to completely fill therewith recessed portions 4 having a width of 1 $\mu$m in the layer formed by the photoresist 3 (FIG. 1(c)).

Figure 1A:
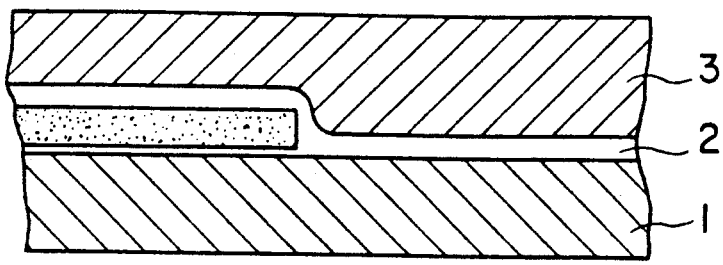
FIGS. 1 to 4 are process diagrams showing a method of forming a fine pattern according to first to fourth embodiments of this invention, respectively.
Figure 1B:
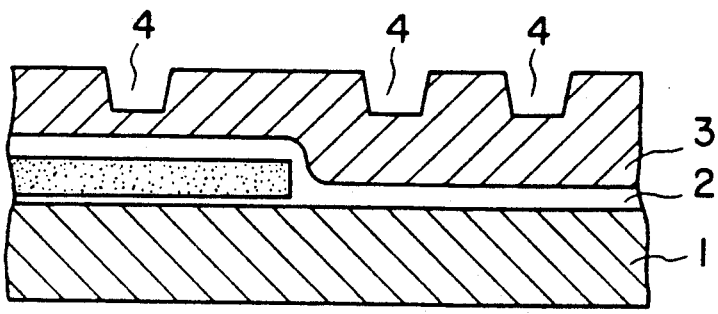
Figure 1C:
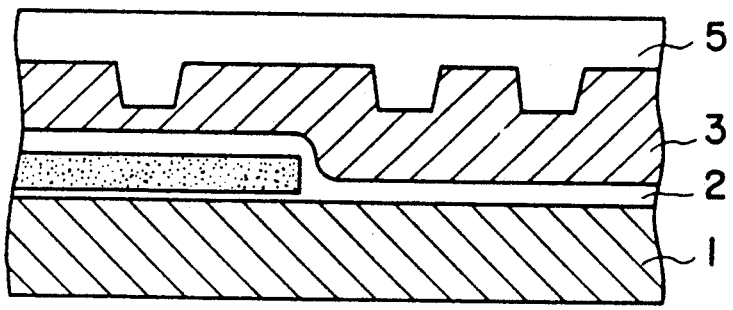
Figure 1D:
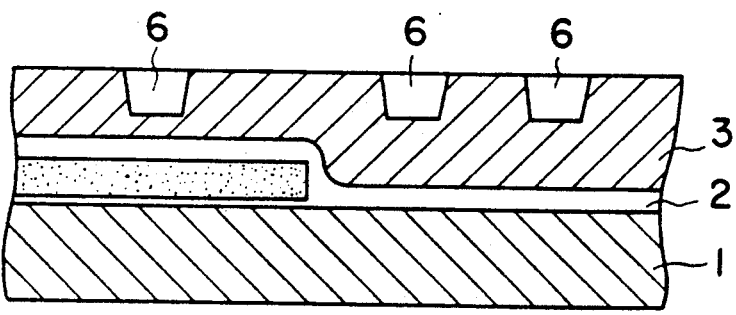
Figure 1E:
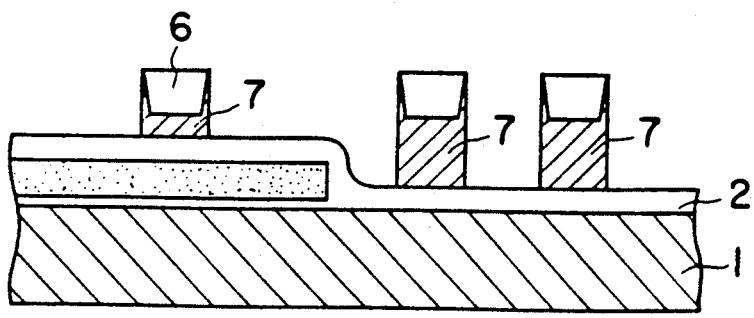
Figure 2A:
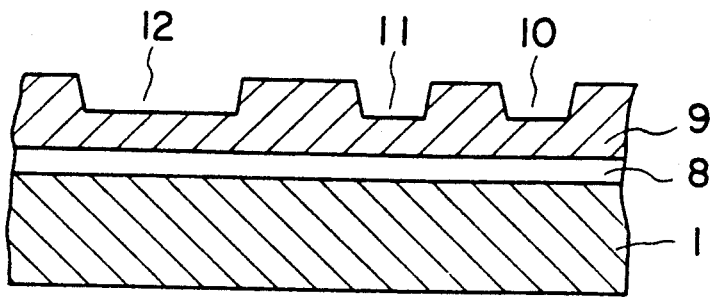
Figure 2B:
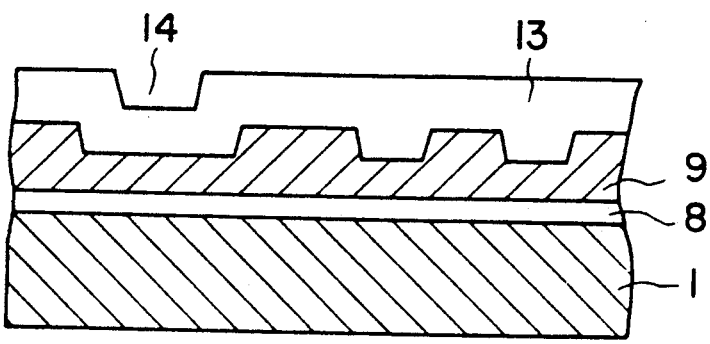
Figure 2C:
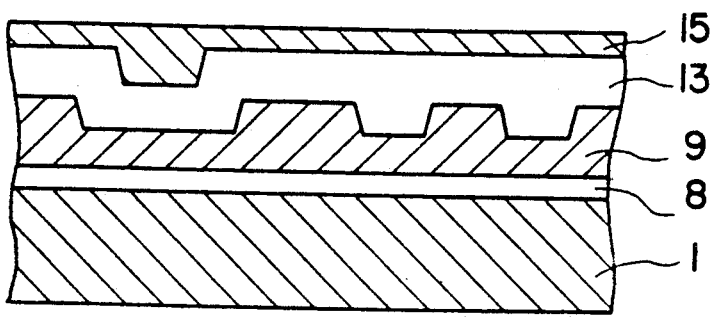
Figure 2D:
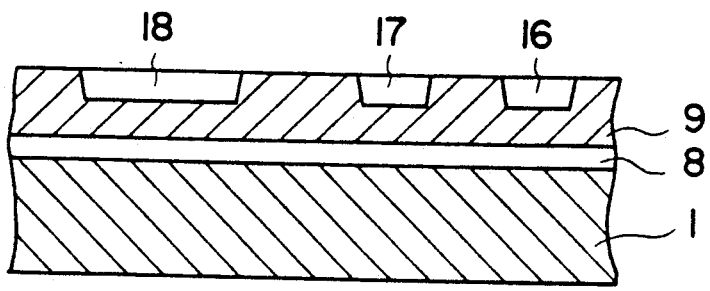
Figure 2E:
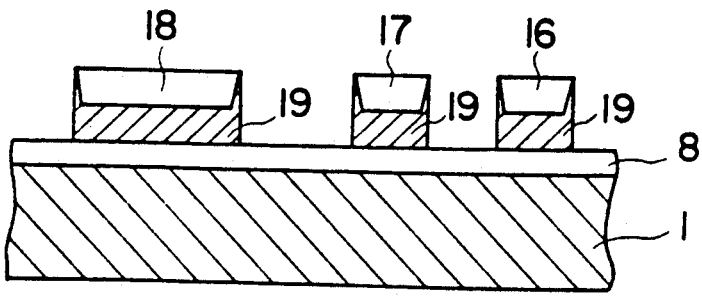

Then, etch back is applied to the entire surface of the SiO$_2$ film 5, thus allowing SiO$_2$ film 6 to remain only within the recessed portions 4 formed in the photresist layer 3 (FIG. 1(d)). At this time, diluted fluoric acid was used for etch back in the first embodiment. In addition, etching may be conducted using an activated species of fluoric gas obtained from CF$_4$/O$_2$ plasma, or etching may be conducted by RIE (Plasma Etching) method using CHF$_3$/O$_2$ as its main component.

With the SiO$_2$ films 6 remaining within the recessed portions 4 being as a mask, by RIE method using an etching gas containing O$_2$ as its major component, anisotropic etching of the photoresist 3 is carried out, thus allowing photoresists 7 to remain below the SiO$_2$ films 6. Thus, a photoresist pattern is formed by these remaining photoresists 7 (FIG. 1(e)). Thereafter, although not shown, with the SiO$_2$ films 6 and the remaining photoresists 7 being as a mask, the underlying film 2 is subjected to etching to implement patterning of the film 2. By this patterning, a fine wiring pattern of film 2 of a conductive film, such as, for example, a polysilicon film or an aluminum film having an offset is formed.

As just described above, in accordance with the first embodiment, a pattern having a limit resolution of photoresist can be provided also in a photoresist formed on a foundation or underlying layer having an offset, and particularly the space pattern can be formed so that it is finer than resolution.

A method of forming a fine pattern according to a second embodiment of this invention will be described with reference to FIG. 2. On a substrate 1, a film 8 of a conductive film, such as, for example, a polysilicon film or an aluminum film similar to that in the first embodiment is formed. In the case of the above-mentioned first embodiment, film 2 is subjected to patterning into wiring lines having a width of 1 $\mu$m. In contrast, the second embodiment is concerned with the case that film 8 is subjected to patterning into wiring lines having a variety of different widths. After a photoresist 9 is thickly coated on the film 8, recessed portions 10, 11 and 12 exposed to the outside, and having a depth of approximately 0.5 $\mu$m and a diversity of widths are formed in the layer formed by the photoresist 9. The pattern side surfaces of the photoresist 9 defining these recessed portions 10, 11 and 12 have a gentle regular taper or inclination (FIG. 2(a)).

Using LPD method, a silicon film 13 having a film thickness of about 1 $\mu$m is deposited on the photoresist 9. However, even if SiO$_2$ film 13 is thickly deposited in this way, it is not completely filled within the recessed portion 12 having a width of 2 $\mu$m or more, so that a recessed portion 14 exposed to the outside remains in the SiO$_2$ film 13 (FIG. 2(b)). A photoresist 15 is then coated on the SiO$_2$ film 13 by spin-coating method to fill the recessed portion 14 in the SiO$_2$ film 13 therewith, thus allowing the photoresist 15 surface to be planar (FIG. 2(c)).

By RIE method using an etching gas containing C$_2$F$_6$/CHF$_3$/O$_2$ as its major component, etching of the photoresist 15 and the SiO$_2$ film 13 is carried out. At this time, the etching condition is set so that etch rates for the photoresist 15 and the SiO$_2$ film 13 are nearly equal to each other. By etch back under this condition, SiO$_2$ films 16, 17 and 18 are caused to remain only within recessed portions 10, 11 and 12 in the photoresist 9, respectively, (FIG. 2(d)).

With the SiO$_2$ films 16, 17 and 18 respectively remaining within the recessed portions 10, 11 and 12 being as a mask, anisotropic etching of the photoresist 9 is carried out by RIE method using an etching gas containing O$_2$ as its major component, thus allowing photoresists 19 to remain below the SiO$_2$ films 16, 17 and 18. By these remaining photoresists 19, a photoresist pattern is formed (FIG. 2(e)). Thereafter, although not shown, with the SiO$_2$ films 16, 17 and 18, and the remaining photoresists 19 being as a mask, the underlying film 8 is subjected to etching to carry out patterning of the film 8. Thus, wiring lines having various widths comprised of the film 8 of a conductive film, such as, for example, a polysilicon film or an aluminum film are formed.

As just described above, in accordance with the method of forming a fine pattern using photoresist of the second embodiment, a line pattern having various widths can be obtained and the space pattern is formed so that it is finer than resolution.

Then, a method of forming a fine pattern according to a third embodiment of this invention will be described with reference to FIG. 3. On a substrate 1, a film 20 of an insulating film, such as, for example, a silicon oxide film is formed. In the case of the above-mentioned first and second embodiments, films 2 and 8 formed as a conductive film, such as, for example, a polysilicon film or an aluminum film are subjected to patterning. Differently from this, the third embodiment is concerned with the case that fine holes such as contact holes are opened in a film of an insulating film. After a photoresist 21 having a film thickness of about 1.5 $\mu$m is first coated on the film 20, exposure and development processing is applied to predetermined sites or portions to remove them so that recessed portions 22 having a depth of 1 $\mu$m are formed, thus leaving projecting portions 23 only at sites corresponding to openings (FIG. 3(a)).

Figure 3A:
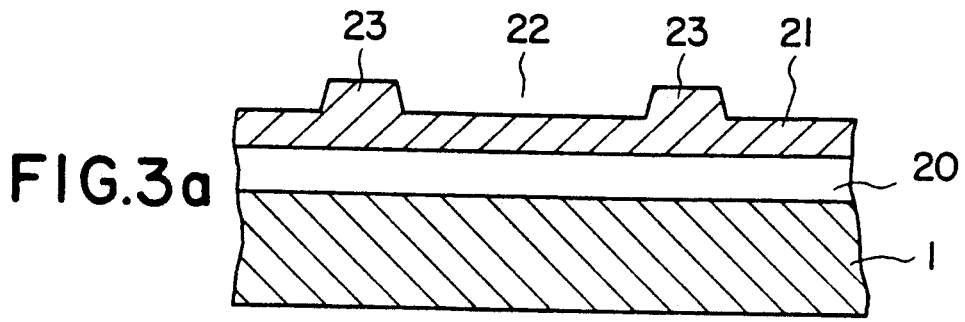
Figure 3B:
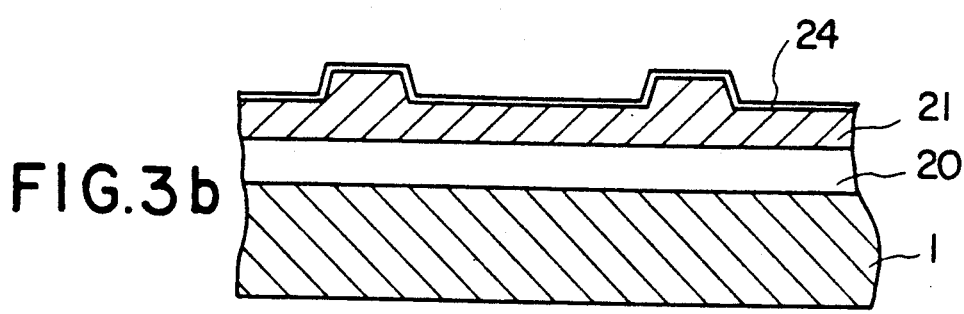
Figure 3C:
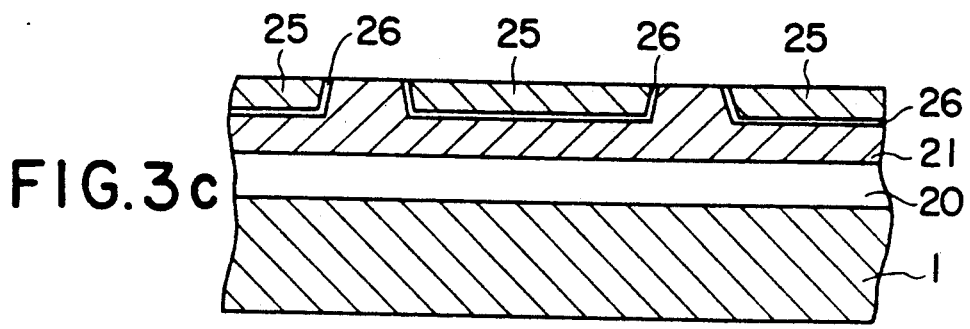
Figure 3D:
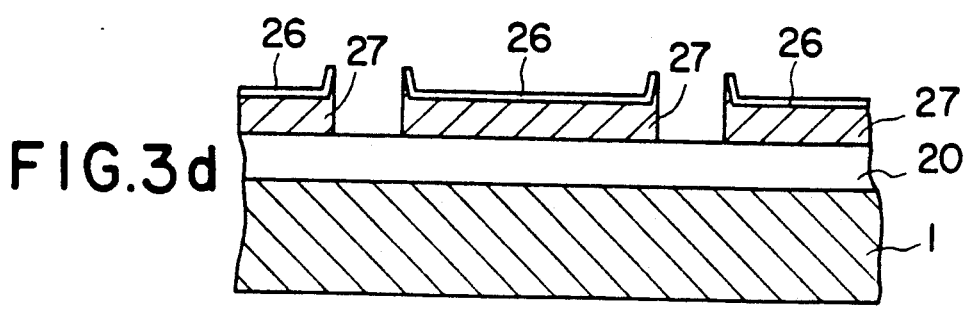

Using LPD method, a $SiO_2$ film 24 having a film thickness of 0.3 $\mu$m is deposited on photoresists 22 including projecting portions 23 (FIG. 3(b)). Further, a photoresist 25 is coated on the $SiO_2$ film 24, thus allowing the photoresist 25 surface to be planar. To realize this, by RIE method using an etching gas containing $C_2F_6/CHF_3/O_2$ as its major component, etching of the photoresist 25 and the $SiO_2$ film 24 is carried out. At this time, the etching condition is set so that etch rates for photoresist 25 and $SiO_2$ film 24 are nearly equal to each other. By etch back under this condition, $SiO_2$ film 24 on the top of each projecting portion 23 is removed, thus allowing the $SiO_2$ films 26 of the remainder to remain as they are (FIG. 3(c)).

Then, with the remaining $SiO_2$ films 26 being as a mask, by RIE method using an etching gas containing $O_2$ as its major component, anisotropic etching of the photoresist 22 is carried out. At this time, photoresists 25 on $SiO_2$ films 26 are removed by etching. However, since $SiO_2$ films 26 are little subjected to etching, only photoresists 22 of the projecting portions 23 corresponding to openings are removed by etching, so that photoresists 27 remain below the $SiO_2$ films 26, respectively (FIG. 3(d)). By these remaining photoresists 27, a photoresist pattern is formed. Thereafter, although not shown, with the photoresists 27 being as a mask, the film 20 is subjected to etching. Thus, fine contact holes are formed in the film 20 of an insulating film such as a silicon oxide film.

As just described above, in accordance with the method of forming a fine pattern using photoresist of the third embodiment, it is possible to form contact holes finer than a limit resolution of photoresist.

Meanwhile, when exposure is conducted using electron beam in forming an uneven pattern on the surface of photoresist thickly coated in the above-described first to third embodiments, the photoresist has little influence of back scattering from the substrate at the time of exposure because it is thick, resulting in no need of back scattering correction having been implemented. Thus, writing is simplified to much extent. In the case of electron beam, such an effect may be obtained by using a condition where an acceleration voltage at the time of writing is set to a small value, thus to expose only the outermost layer portion having a depth of 0.3 to 0.5 $\mu$m of the surface of the photoresist thickly coated.

In the case of exposure using light, the photoresist pattern may be collapsed by reflected light from the substrate, and particularly in the case that a film subjected to etching with such a photoresist being as a mask is an aluminum film, pattern collapse may conspicuously appear to such an extent that it is called "inversed mustache", or the side surfaces of the photoresist may become notched by interference light, giving rise to a cause of unevenness in dimensions. However, because of the fact that the film thickness of the photoresist is thick, and that only the outermost layer portion of the photoresist is subjected to exposure and development in the above-described first to third embodiments, such a phenomenon does not occur in any degree.

In addition, because there is no need that the depth of recessed portions formed in the resist layer is not so deep, times for exposure and development are reduced. Especially, the exposure time by stepper is reduced, resulting in greatly improved producibility.

Figure 4A:
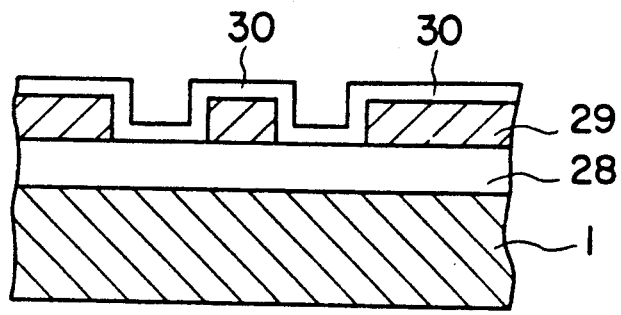
Figure 4B:
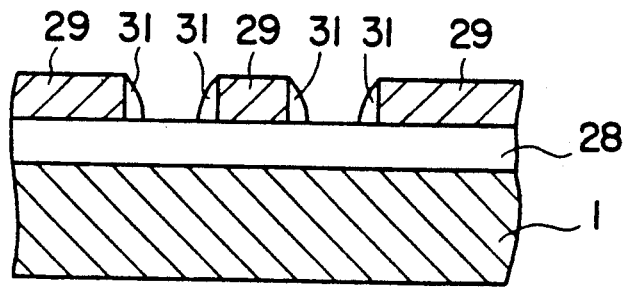

Then, a method of forming a fine pattern according to a fourth embodiment of this invention will be described with reference to FIG. 4. On the substrate 1, a film 28 constituted as an insulating film, such as, for example, a BPSG (Boro-Phospho-Silicate Glass) film formed using CVD (Chemical Vapor Deposition) method is formed. After a photoresist having a film thickness of about 1.5 $\mu$m is coated on the film 28, photoresists at sites corresponding to opening portions are removed so that the diameter of the photoresists removed takes a value as minimum as possible, e.g., 1.2 $\mu$m in the fourth embodiment, thus to form a photoresist 29 having been subjected to patterning. Further, using LPD method, an $SiO_2$ film 30 having a film thickness of 0.3 $\mu$m is deposited on the entire surface (FIG. 4(a)).

Then, RIE etch back of the $SiO_2$ film 30 is carried out to form spacers 31 comprised of remaining $SiO_2$ films on the photoresist 29 side surfaces. In the fourth embodiment, the widths of these spacers 31 were 0.25 $\mu$m (FIG. 4(b)). Thereafter, although not shown, with the photoresists 29 and the spacers 31 being as a spacer, the film 28 is removed by etching. Because remaining spacers 31 become unnecessary after contact holes are opened, they are removed by diluted fluoric acid after the photoresists 29 are removed. Since the etch rate for spacers 31 comprised of $SiO_2$ film deposited by LPD method with respect to diluted fluoric acid is faster 5 to 10 times than the etching speed for the film 28 of BPSG film deposited by CVD method, the film 28 was not subjected to etching to a great extent in etching the spacers 31.

As just described above, in accordance with the fourth embodiment, because of presence of spacers 31 on the photoresist 29 sides, it is possible to open contact holes finer than minimum ones which can be formed using photoresist 29, in the film 28 of an insulating film such as a BPSG film. In addition, the side surfaces of the films 28 defining contact holes are to have a tape or inclination at the same time, thus greatly contributing to an improvement in step coverage in depositing film at the subsequent steps.

While the contact pattern in the case of opening fine holes such as contact holes has been described in the above-mentioned fourth embodiment, this invention can be similarly applied to a wiring pattern in the case of carrying out patterning of wiring lines and spaces.

Figure 5:
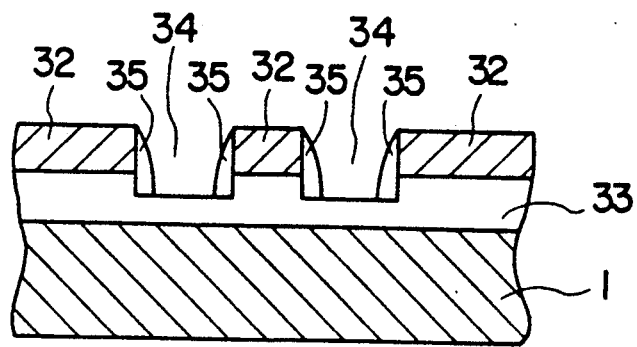
FIG. 5 is a schematic cross sectional view for explaining a method of forming a fine pattern according to a modification of the fourth embodiment.
Figure 6A:
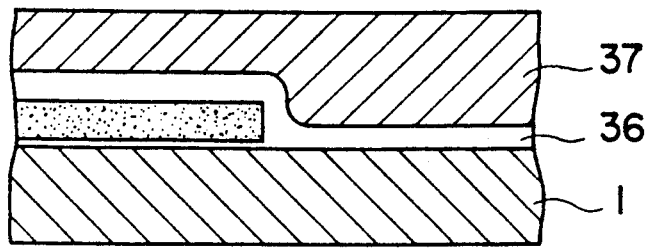
FIG. 6 is a process diagram showing a method of forming a fine pattern according to a fifth embodiment of this invention.
Figure 6B:
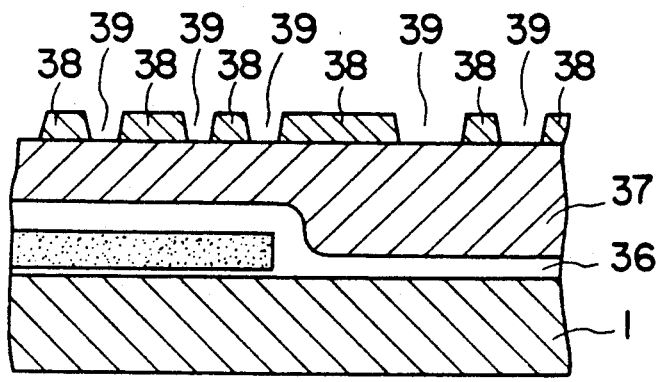
Figure 6C:
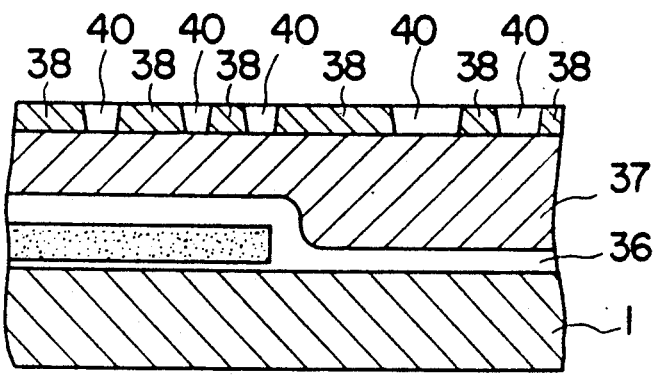
Figure 6D:
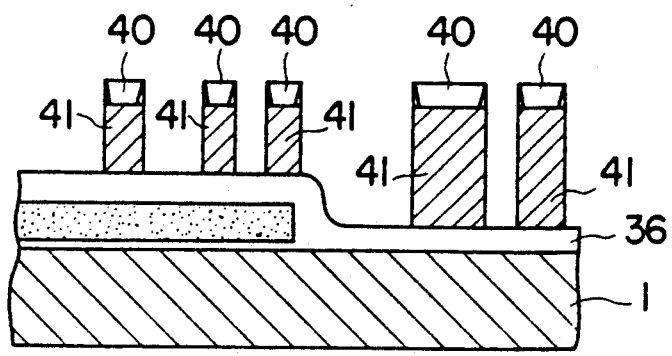

A modification of the fourth embodiment will be described with reference to FIG. 5. After portions of a film 33 is subjected to etching with the photoresists 32 having been patterning being as a mask to remove them, thus to form recessed portions 34 within the photoresist 32, spacers 35 of glass or metal are formed on the side surfaces of projecting portions of the photoresist 32. With the projecting portions of the photoresist 32 having spacers 32 on their side surfaces thereof being as a mask, the film 33 is subjected to etching for a second time to open contact holes. Because of the spacers 35 on the side surfaces of the projecting portions of the photoresist 32, patterning can be implemented in a manner that contact holes opened have a step-shaped or inclined side surface.

Finally, a method of forming a fine pattern according to a fifth embodiment of this invention will be described with reference to FIG. 6. On a substrate 1, a film 36 of a conductive film, such as, for example, a polysilicon film or an aluminum film is formed in a manner similar to that in the above-mentioned first and second embodiments. The film 36 subjected to patterning in accordance with a wiring pattern has an offset on its surface. An organic film 37 which is not sensitive and is not also active with electron beam is sufficiently thickly coated or deposited to thereby eliminate the offset, thus allowing the organic film 37 surface to be planar. This organic film is composed of a material obtained by excluding sensitive agent from photoresist. In the fifth embodiment, the thickness of the organic film 37 was about 2 $\mu$m (FIG. 6(a)).

Further, a photoresist having a film thickness of 0.5 $\mu$m is coated on the organic film 37. As just described above, a double-layered film comprising organic film 37 and photoresist is used in the fifth embodiment in place of the photoresist 3 in the above-mentioned first embodiment.

Then, a pattern having a minimum width of 0.6 $\mu$m is transferred onto the photoresist. At this time, exposure is conducted by using electron beam. Thus, photoresists 38 having been subjected to patterning into extremely small spaces are formed on the organic film 37 (FIG. 6(b)). By employing such a double layer structure of non-sensitive and sensitive materials, it is possible to form a pattern only on the photoresist of the upper layer even if the condition for applying exposure and development only to the outermost layer portion of the sensitive photoresist is not particularly set as in the first to third embodiments.

Using LPD method, a SiO$_2$ film is deposited on the entire surface. Then, the SiO$_2$ film is subjected to etch back over the entire surface thereof, thus allowing SiO$_2$ films 40 to remain only within recessed portions 39 formed by photoresists 38 having been subjected to patterning into extremely small spaces (FIG. 6(c)). With the SiO$_2$ films 40 remaining within the recessed portions 39 being as a mask, anisotropic etching of the photoresists 38 and the organic film 37 is carried out, thus allowing organic films 41 to remain below the SiO$_2$ films 40. At this time, by RIE method containing O$_2$ as its major component, etching of the organic film 37 can be carried out completely in the same manner as that in etching of the photoresist. Thus, an organic film pattern is formed by the remaining organic films 41 (FIG. 6(d)). Thereafter, with the SiO$_2$ films 40 and the remaining organic films 41 being as a mask, the underlying film 36 is subjected to etching to carry out patterning of the film 36.

As just described above, in accordance with the fifth embodiment, even in the film 36 of a conductive film, such as, for example, a polysilicon film or an aluminum film having an offset on the surface thereof, wiring lines comprised of such a film 36 having an extremely small width can be formed.

It is to be noted that while non-sensitive organic film is used and electron beam is used for exposure of the photoresist on the organic film in the above-mentioned fifth embodiment, light may be used for exposure. In that case, an opaque material for preventing reflection may be used for the underlying organic film, thus preventing lowering of resolution of the photoresist caused by a reflected light from the underlying layer.

Further, while pattern transfer to the photoresist is conducted by using light or electron beam in the above-mentioned first to fifth embodiments, the same effect may be obtained by focused ion beam or X-ray.

Furthermore, a method of depositing SiO$_2$ film onto the photoresist having been subjected to pattern transfer is not limited to LPD method employed in the above-mentioned first to fifth embodiments, such as deposition may be conducted by using other means for depositing film at a low temperature, e.g., non-electrolytic plating method, sputtering method, bias sputtering method, etc.

Also in connection with the film to be deposited, as long as a material has a different etch rate and can be used as a mask in etching photoresist or organic film by RIE method using an etching gas containing O$_2$ as its major component, such a film to be deposited is not limited to SiO$_2$ film, but may be metal film or silicide film.

In addition, while positive resist is used for photoresist in the above-mentioned first to fifth embodiments, this invention can be applicable to negative resist.

Advantages with the Invention

As stated above, in accordance with this invention, a fine pattern of less than limit resolution of resist can be formed, and the number of process steps can be reduced as compared to the conventional multi-layer resist process.

What is claimed is:

1. A method of forming a fine pattern, comprising the steps of:
    coating a photoresist on a surface on which a pattern is to be formed;
    forming a plurality of recessed portions defining a predetermined fine pattern at the top surface of said photoresist;
    depositing a material having an etch rate different from that of said photoresist into said recessed portions, said material being deposited by a liquid phase deposition method; and
    removing said photoresist with said material deposited within said recessed portions being as a mask.

2. A method of forming a fine pattern as claimed in claim 1, wherein said coating step comprises sufficiently thickly coating said photoresist so that the surface of said photoresist becomes planar even if said surface on which a pattern is to be formed has an offset.

3. A method of forming a fine pattern as claimed in claim 1, wherein said depositing step comprises depositing said material on the entire surface of said photoresist, thereafter to apply etch back to said material, thus allowing said material to remain within said recessed portions.

4. A method of forming a fine pattern as claimed in claim 3, wherein a second photoresist is formed on said deposited material, thereafter to apply etch back to said second photoresist and said material, thus allowing said material to remain within said recessed portions.

5. A method as claimed in claim 1, wherein said material is deposited at the top surface of said photoresist by immersing said surface into an immersion liquid of an acid saturated with $SiO_2$.

6. A method as claimed in claim 1, wherein said material is deposited at the top surface of said photoresist by immersing said surface into an immersion liquid of an acid saturated with a metal.

* * * * *